United States Patent
Choi et al.

(10) Patent No.: US 7,586,123 B2
(45) Date of Patent: Sep. 8, 2009

(54) THIN FILM TRANSISTOR (TFT) ARRAY SUBSTRATE AND FABRICATING METHOD THEREOF THAT PROTECT THE TFT AND A PIXEL ELECTRODE WITHOUT A PROTECTIVE FILM

(75) Inventors: Young Seok Choi, Gumi-si (KR); Byung Yong Ahn, Daegu (KR); Ki Sul Cho, Gumi-si (KR); Hong Woo Yu, Gumi-si (KR)

(73) Assignee: LG. Display Co., Ltd., Seoul (KR)

( * ) Notice: Subject to any disclaimer, the term of this patent is extended or adjusted under 35 U.S.C. 154(b) by 191 days.

(21) Appl. No.: 11/149,689

(22) Filed: Jun. 10, 2005

(65) Prior Publication Data
US 2005/0285195 A1    Dec. 29, 2005

(30) Foreign Application Priority Data
Jun. 25, 2004   (KR) ...................... 10-2004-0048259

(51) Int. Cl.
*H01L 27/01* (2006.01)
(52) U.S. Cl. .................... 257/72; 257/223; 257/227; 257/291; 257/292; 257/439; 257/443; 257/655; 257/E27.1; 257/E27.125; 257/E27.112; 257/E27.147; 257/E27.151; 257/E23.016
(58) Field of Classification Search ............... 257/223, 257/227, 291, 292, 439, 443, 655, E27.125, 257/E27.112, E27.147, E27.016, E29.151
See application file for complete search history.

(56) References Cited

U.S. PATENT DOCUMENTS

| 5,302,987 A | * | 4/1994 | Kanemori et al. ........... 349/143 |
| 5,474,941 A | * | 12/1995 | Mitani et al. ................ 438/151 |
| 5,712,494 A |   | 1/1998 | Akiyama et al. |

(Continued)

FOREIGN PATENT DOCUMENTS

DE    198 08 990 A1    3/1999

(Continued)

OTHER PUBLICATIONS

Office Action dated Jan. 16, 2006 for corresponding French Application No. 0506050000.

(Continued)

*Primary Examiner*—Marcos D. Pizarro
*Assistant Examiner*—Marc Armand
(74) *Attorney, Agent, or Firm*—Brinks Hofer Gilson & Lione

(57) ABSTRACT

A thin film transistor array substrate and a fabricating method thereof are disclosed. The thin film transistor array substrate protects a thin film transistor without a protective film and accordingly reduces the manufacturing cost. In the thin film transistor array substrate, a gate electrode is connected to a gate line. A source electrode is connected to a data line crossing the gate line to define a pixel area. A drain electrode is opposed to the source electrode with a channel therebetween. A semiconductor layer is in the channel. A pixel electrode in the pixel area contacts the drain electrode over substantially the entire overlapping area between the two. A channel protective film is provided on the semiconductor layer corresponding to the channel to protect the semiconductor layer.

9 Claims, 22 Drawing Sheets

U.S. PATENT DOCUMENTS

| | | |
|---|---|---|
| 5,811,836 A | 9/1998 | Ha |
| 5,888,855 A | 3/1999 | Nagahisa et al. |
| 5,903,055 A * | 5/1999 | Takayama .................. 257/771 |
| 6,114,184 A | 9/2000 | Matsumoto et al. |
| 6,268,895 B1 * | 7/2001 | Shimada et al. ............ 349/110 |
| 6,674,495 B1 * | 1/2004 | Hong et al. ................... 349/43 |
| 2001/0014493 A1 | 8/2001 | Inoue et al. |
| 2002/0052057 A1 | 5/2002 | Wong |
| 2002/0097349 A1 | 7/2002 | Park |
| 2002/0170185 A1 | 11/2002 | Kondo et al. |
| 2002/0171085 A1 | 11/2002 | Suzawa et al. |
| 2003/0160236 A1 | 8/2003 | Yamazaki et al. |
| 2003/0197187 A1 * | 10/2003 | Kim et al. .................... 257/83 |
| 2004/0119903 A1 * | 6/2004 | Chang et al. .................. 349/43 |

FOREIGN PATENT DOCUMENTS

| | | |
|---|---|---|
| DE | 10 2004 053 587 A1 | 9/2005 |
| EP | 0 493 113 | 7/1992 |
| EP | 0 493 113 A2 | 7/1992 |

OTHER PUBLICATIONS

Office Action for corresponding Chinese Patent Application Serial No. 200510077149.0 dated Jun. 22, 2007.

First Office Action issued in corresponding German Patent Application No. 10 2005 027 445.5, dated Oct. 23, 2007.

* cited by examiner

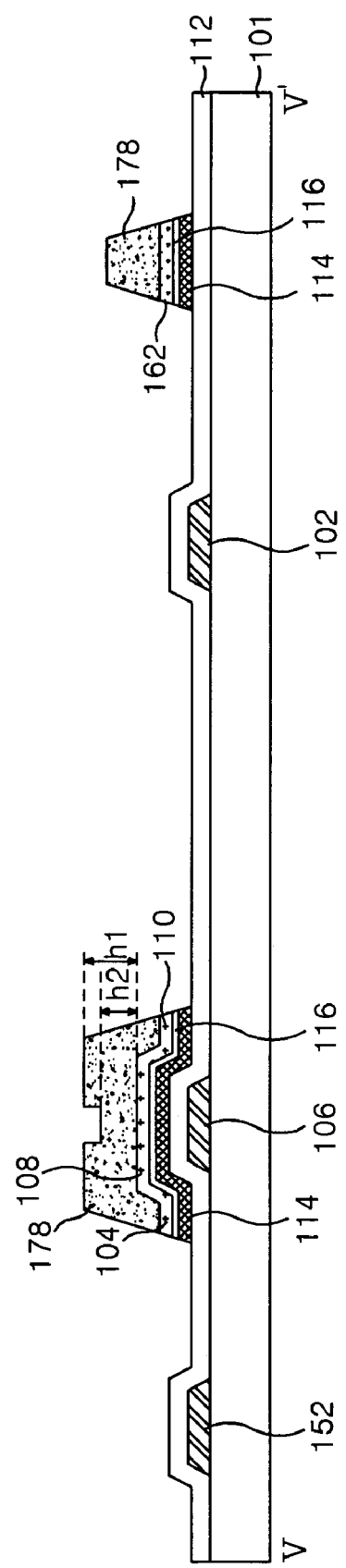

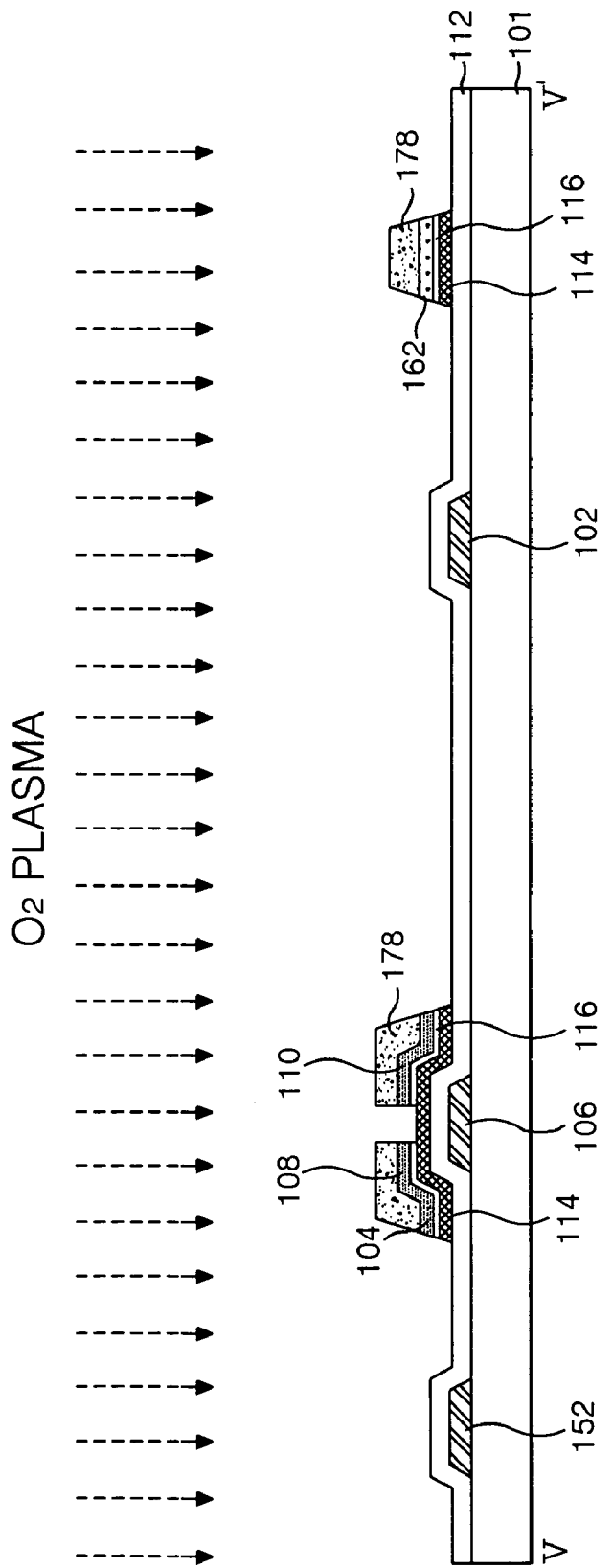

THIN FILM TRANSISTOR (TFT) ARRAY SUBSTRATE AND FABRICATING METHOD THEREOF THAT PROTECT THE TFT AND A PIXEL ELECTRODE WITHOUT A PROTECTIVE FILM

This application claims the benefit of Korean Patent Application No. P2004-48259 filed in Korea on Jun. 25, 2004, which is hereby incorporated by reference.

1. Field of the Invention

This invention relates to a thin film transistor array substrate, and more particularly to a thin film transistor array substrate and a fabricating method thereof that are adaptive for protecting a thin film transistor without a protective film as well as reducing a manufacturing cost.

2. Description of the Related Art

Generally, a liquid crystal display (LCD) controls light transmittance of a liquid crystal using an electric field to thereby display a picture. The LCD drives a liquid crystal by an electric field formed between a pixel electrode and a common electrode arranged in opposition to each other on upper and lower substrates.

The LCD includes a thin film transistor array substrate (lower array substrate) and a color filter array substrate (upper array substrate) that are joined in opposition to each other, a spacer for constantly keeping a cell gap between the two array substrates, and a liquid crystal filled in the cell gap.

The thin film transistor array substrate is comprised of a plurality of signal wirings and thin film transistors, and an alignment film coated thereon that provides an initial alignment of the liquid crystal. The color filter array substrate is comprised of a color filter for implementing color, a black matrix for preventing light leakage, and an alignment film coated thereon that provides an initial alignment of the liquid crystal.

In such an LCD, the thin film transistor array substrate has a complicated fabrication process, which causes a large rise in manufacturing cost of the liquid crystal display panel because it involves a semiconductor process and uses a plurality of mask processes. In order to solve this, the thin film transistor array substrate has been developed toward a reduction in the number of mask processes. This is because one mask process includes a number of individual processes such as thin film deposition, cleaning, photolithography, etching, photo-resist stripping and inspection processes, etc. Recently, a four mask process has been used to fabricate the thin film transistor rather than the standard five mask process.

FIG. 1 is a plan view illustrating a lower transistor array substrate adopting a related art four-round mask process, and FIG. 2 is a section view of the thin film transistor array substrate taken along the II-II' line in FIG. 1.

Referring to FIG. 1 and FIG. 2, a thin film transistor array substrate of a related art liquid crystal display panel includes a gate line 2 and a data line 4 provided on a lower substrate 1 in such a manner to intersect each other with having a gate insulating film 12 therebetween, a thin film transistor 30 provided at each intersection, a pixel electrode 22 provided at a cell area defined by the intersection structure, a storage capacitor 40 provided at an overlapping portion between the gate line 2 and a storage electrode 28, a gate pad 50 connected to the gate line 2, and a data pad 60 connected to the data line 4.

The gate line 2 for applying a gate signal and the data line 4 for applying a data signal are provided at an intersection structure to thereby define a pixel area 5.

The thin film transistor 30 allows a pixel signal on the data line 4 to be charged into the pixel electrode 22 and kept in response to a gate signal on the gate line 2. To this end, the thin film transistor 30 includes a gate electrode 6 connected to the gate line 2, a source electrode 8 connected to the data line 4, and a drain electrode 10 connected to the pixel electrode 22. Further, the thin film transistor 30 includes an active layer 14 overlapping with the gate electrode 6 with a gate insulating film 12 therebetween to define a channel between the source electrode 8 and the drain electrode 10.

The active layer 14 also overlaps with the data line 4, a lower data pad electrode 62 and a storage electrode 28. On the active layer 14, an ohmic contract layer for making contact with the data line 4, the source electrode 8, the drain electrode 10, the lower data pad electrode 62 and the storage electrode 28 is further provided.

The pixel electrode 22 is connected, via a first contact hole 20 passing through a protective film 18, to the drain electrode 10 of the thin film transistor 30, and is provided at a pixel area 5.

Thus, an electric field is formed between the pixel electrode 22 to which a pixel signal is supplied via the thin film transistor 30 and a common electrode (not shown) supplied with a reference voltage. Liquid crystal molecules between the thin film transistor array substrate and the color filter array substrate are rotated by the electric field due to dielectric anisotropy. Transmittance of light through the pixel area 5 is differentiated depending upon a rotation extent of the liquid crystal molecules, thereby implementing a gray level scale.

The storage capacitor 40 consists of the gate line 2, and a storage electrode 28 overlapping with the gate line 2 with having the gate insulating film 12, the active layer 14 and the ohmic contact layer 16 therebetween. Herein, the storage electrode 28 is connected, via a second contact hole 42 defined at the protective film 18, to the pixel electrode 22. The storage capacitor 40 allows a pixel signal charged in the pixel electrode 22 to be stably maintained until the next pixel signal is charged.

The gate pad 50 is connected to a gate driver (not shown) to apply a gate signal to the gate line 2. The gate pad 50 consists of a lower gate pad electrode 52 extended from the gate line 2, and an upper gate pad electrode 54 connected, via a third contact hole 56 passing through the gate insulating film 12 and the protective film 18, to the lower gate pad electrode 52.

The data pad 60 is connected to a data driver (not shown) to apply a data signal to the data line 4. The data pad 60 consists of a lower data pad electrode 62 extended from the data line 4, and an upper data pad electrode 64 connected, via a fourth contact hole 66 passing through the protective film 18, to an upper data pad electrode 64 connected to the lower data pad electrode 62.

Hereinafter, a method of fabricating the thin film transistor array substrate of the liquid crystal display panel having the above-mentioned structure adopting the four-round mask process will be described in detail with reference to FIG. 3A to FIG. 3D.

Referring to FIG. 3A, a first conductive pattern group including the gate line 2, the gate electrode 6 and the lower gate pad electrode 52 are provided on the lower substrate 1 by the first mask process.

More specifically, a gate metal layer is formed on the lower substrate 1 by a deposition-technique such as sputtering. Then, the gate metal layer is patterned by photolithography and etching using a first mask to thereby form the first conductive pattern group including the gate line 2, the gate electrode 6 and the lower gate pad electrode 52. The gate metal layer is made from an aluminum group metal, etc.

Referring to FIG. 3B, the gate insulating film 12 is coated onto the lower substrate 1 provided with the first conductive pattern group. Further, semiconductor patterns including the active layer 14 and the ohmic contact layer 16; and a second conductive pattern group including the data line 4, the source electrode 8, the drain electrode 10, the lower data pad electrode 62 and the storage electrode 28 are formed on the gate insulating film 12 by the second mask process.

More specifically, the gate insulating film 12, an amorphous silicon layer, a n+ amorphous silicon layer and a data metal layer are sequentially provided on the lower substrate 1 provided with the first conductive pattern group by deposition techniques such as plasma enhanced chemical vapor deposition (PECVD) and sputtering, etc. Herein, the gate insulating film 12 is formed from an inorganic insulating material such as silicon nitride ($SiN_x$) or silicon oxide ($SiO_x$). The data metal layer is selected from molybdenum (Mo), titanium (Ti), tantalum (Ta) or a molybdenum alloy, etc.

Then, a photo-resist pattern is formed on the data metal layer by photolithography using a second mask. In this case, a diffractive exposure mask having a diffractive exposing part at a channel portion of the thin film transistor is used as a second mask, thereby allowing a photo-resist pattern of the channel portion to have a lower height than other source/drain pattern portion.

Subsequently, the data metal layer is patterned by wet etching using the photo-resist pattern to thereby provide the second conductive pattern group including the data line 4, the source electrode 8, the drain electrode 10 being integral to the source electrode 8 and the storage electrode 28.

Next, the n+ amorphous silicon layer and the amorphous silicon layer are patterned at the same time by a dry etching process using the same photo-resist pattern to thereby provide the ohmic contact layer 14 and the active layer 16.

The photo-resist pattern having a relatively low height is removed from the channel portion by ashing and thereafter the data metal layer and the ohmic contact layer 16 of the channel portion are etched by dry etching. Thus, the active layer 14 of the channel portion is exposed to disconnect the source electrode 8 from the drain electrode 10.

Then, the photo-resist pattern left on the second conductive pattern group is removed by stripping.

Referring to FIG. 3C, the protective film 18 including the first to fourth contact holes 20, 42, 56 and 66 are formed on the gate insulating film 12 provided with the second conductive pattern group.

More specifically, the protective film 18 is entirely formed on the gate insulating film 12 provided with the data patterns by a deposition technique such as plasma enhanced chemical vapor deposition (PECVD). Then, the protective film 18 is patterned by photolithography and etching using a third mask to thereby define the first to fourth contact holes 20, 42, 56 and 66. The first contact hole 20 passes through the protective film 18 to expose the drain electrode 10, whereas the second contact hole 42 passes through the protective film 18 to expose the storage electrode 28. The third contact hole 56 passes through the protective film 18 and the gate insulating film 12 to expose the lower gate pad electrode 52, whereas the fourth contact hole 66 passes through the protective film 18 to expose the lower data pad electrode 62. Herein, when a metal having a large dry etching ratio, such as molybdenum (Mo), is used as the data metal, the first, second and fourth contact holes 20, 42 and 66 pass through the drain electrode 10, the storage electrode 28 and the lower data pad electrode 62, respectively, to thereby expose the side surfaces thereof.

The protective film 18 is made from an inorganic insulating material identical to the gate insulating film 12, or an organic insulating material such as an acrylic organic compound having a small dielectric constant, BCB (benzocyclobutene) or PFCB (perfluorocyclobutane), etc.

Referring to FIG. 3D, third conductive pattern group patterns including the pixel electrode 22, the upper gate pad electrode 54 and the upper data pad electrode 64 are provided on the protective film 18 by the fourth mask process.

More specifically, a transparent conductive film is coated onto the protective film 18 by a deposition technique such as sputtering, etc. Then, the transparent conductive film is patterned by photolithography and etching using a fourth mask to thereby provide the third conductive pattern group including the pixel electrode 22, the upper gate pad electrode 54 and the upper data pad electrode 64. The pixel electrode 22 is electrically connected, via the first contact hole 20, to the drain electrode 10 while being electrically connected, via the second contact hole 42, to the storage electrode 28. The upper gate pad electrode 54 is electrically connected, via the third contact hole 56, to the lower gate pad electrode 52. The upper data pad electrode 64 is electrically connected, via the fourth contact hole 66, to the lower data pad electrode 62.

Herein, the transparent conductive film is formed from indium-tin-oxide (ITO), tin-oxide (TO), indium-tin-zinc-oxide (ITZO) or indium-zinc-oxide (IZO).

The related art thin film transistor array substrate is provided with the protective film 18 for protecting the thin film transistor 30. The protective film 18 is formed by depositing an inorganic insulating material using a PECVD device, or coating an organic insulating material using a spin coater or a spinless coater. Since formation of the protective film 18 uses the PECVD device, spin coater or spinless coater, the manufacturing cost rises.

Also, in the related art thin film transistor array substrate, the data line is often open. In this case, a separate process for repairing the data line is used.

Furthermore, in the related art thin film transistor array substrate, when the protective film 18 is formed from an organic insulating material, the pixel electrode 22 formed thereon is broken due to the protective film 18 being relatively thick. Particularly, the pixel electrode 22 is broken at the side surface of the protective film 18 exposed by a contact hole 20 for contacting the drain electrode 10 with the pixel electrode 22. Thus, since a pixel signal is not supplied via the drain electrode 10 to the pixel electrode 22, a spot defect occurs.

Moreover, in the related art thin film transistor array substrate, the storage capacitor 40 is comprised of the gate line 2 and the storage electrode 28 overlapping with each other with the gate insulating film 12, the active layer 14 and the ohmic contact layer 16 therebetween. In this case, a capacitance value of the storage capacitor 40 is reduced due to the gate insulating film 12, the active layer 14 and the ohmic contact layer 16 having a relatively large thickness for insulating the gate line 2 and the storage electrode 28. Also, a deterioration of picture quality such as a stain is generated due to a relatively low capacitance value of the storage capacitor 40.

SUMMARY OF THE INVENTION

Accordingly, a thin film transistor array substrate and a fabricating method thereof are presented in which a thin film transistor is protected without a protective film and the manufacturing cost reduced.

By way of introduction only, in one embodiment, a thin film transistor array substrate comprises: a gate electrode connected to a gate line; a source electrode connected to a data line crossing the gate line to define a pixel area; a drain electrode opposed to the source electrode with a channel therebetween; a semiconductor layer in the channel; a pixel electrode positioned at the pixel area, substantially all of the pixel electrode overlapping the drain electrode contacting the drain electrode; and a channel protective film provided on the semiconductor layer corresponding to the channel to protect the semiconductor layer in the channel.

In another embodiment, a thin film transistor array substrate comprises a transistor having opposing electrodes and a channel therebetween and a pixel electrode disposed on at least one of the opposing electrodes such that a channel protective film is present between the opposing electrodes but is not present between substantially the entire overlapping portions of the pixel electrode and the at least one opposing electrode.

In another embodiment, a method of fabricating a thin film transistor array substrate comprises: forming a gate electrode on a substrate; forming a gate insulating film on the gate electrode; forming source and drain electrodes and a semiconductor layer in a channel between the source and drain electrodes, and forming a channel protective film on the semiconductor layer to protect the semiconductor layer in the channel; forming the drain electrode on the gate insulating film; and forming a pixel electrode such that substantially all of the pixel electrode overlapping the drain electrode contacts the drain electrode.

In another embodiment, a method of fabricating a thin film transistor array substrate comprises: forming a gate line, a gate electrode connected to the gate line and a first conductive pattern group including a lower gate pad electrode extending from the gate line; forming a gate insulating film to cover the first conductive pattern group; forming a data line crossing the gate line, a source electrode connected to the data line, a drain electrode opposed to the source electrode with a channel therebetween, a second conductive pattern group including a lower data pad electrode extending from the data line, a semiconductor pattern in the channel and a channel protective film corresponding to the channel; forming a contact hole passing through the gate insulating film to expose the lower gate pad electrode; and forming a pixel electrode on the drain electrode such that substantially all of the pixel electrode overlapping the drain electrode contacts the drain electrode, an upper data pad electrode on the lower data pad electrode such that substantially all of the upper data pad electrode overlapping the lower data pad electrode contacts the lower data pad electrode, and a third conductive pattern group including an upper gate pad electrode connected, via a contact hole, to the lower gate pad electrode.

BRIEF DESCRIPTION OF THE DRAWINGS

The following detailed description of the embodiments of the present invention reference the accompanying drawings, in which:

FIG. 8A to FIG. 8F are section views for specifically explaining a method of fabricating the semiconductor pattern, the second conductive pattern group and the channel protective film shown in FIG. 7A and FIG. 7B;

DETAILED DESCRIPTION OF THE PREFERRED EMBODIMENT

Reference will now be made in detail to the preferred embodiments of the present invention, examples of which are illustrated in the accompanying drawings.

Hereinafter, the preferred embodiments of the present invention will be described in detail with reference to FIGS. 4 to 10B.

Figure 1:
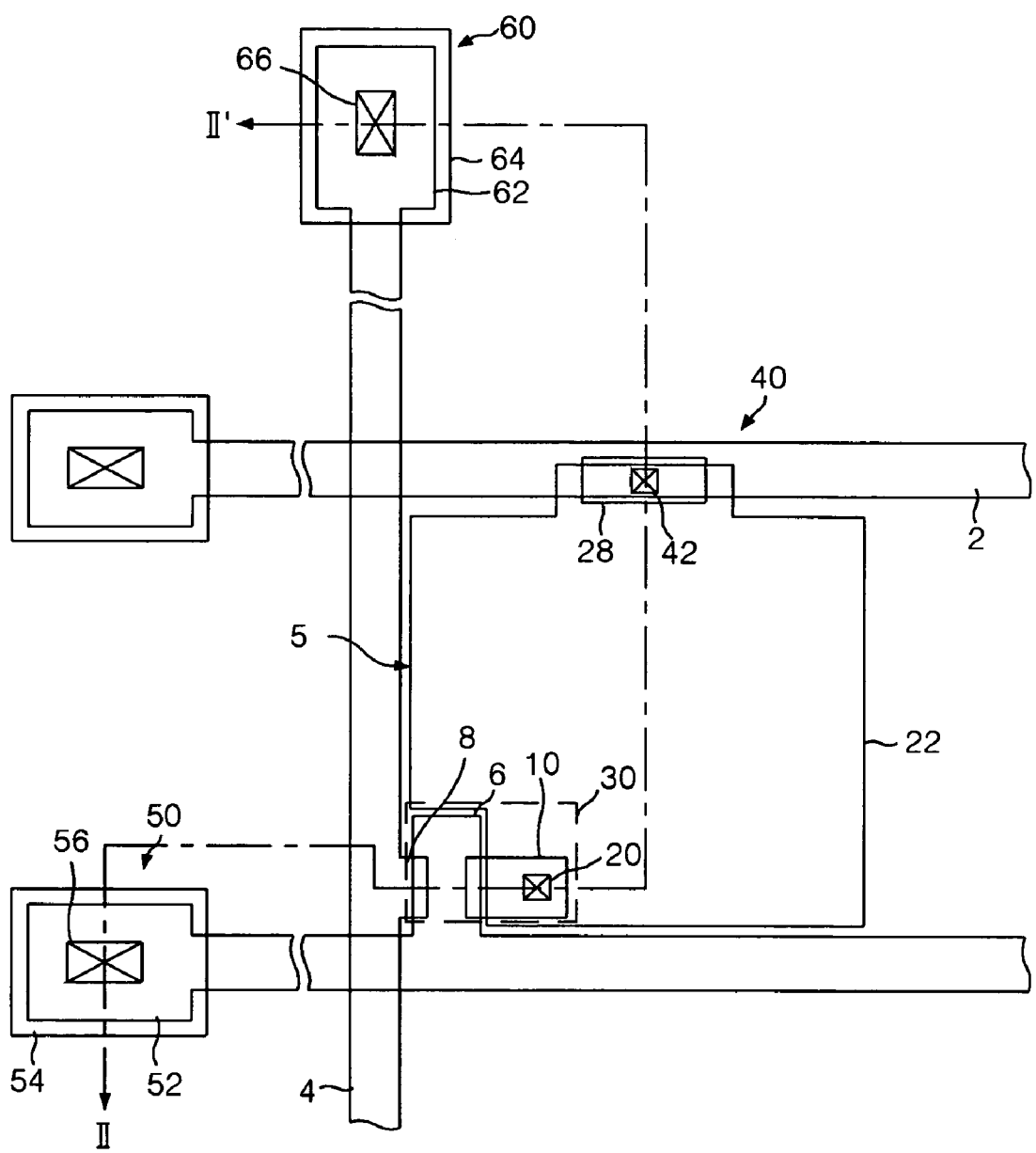
FIG. 1 is a plan view showing a thin film transistor array substrate of a related art liquid crystal display panel.
Figure 2:
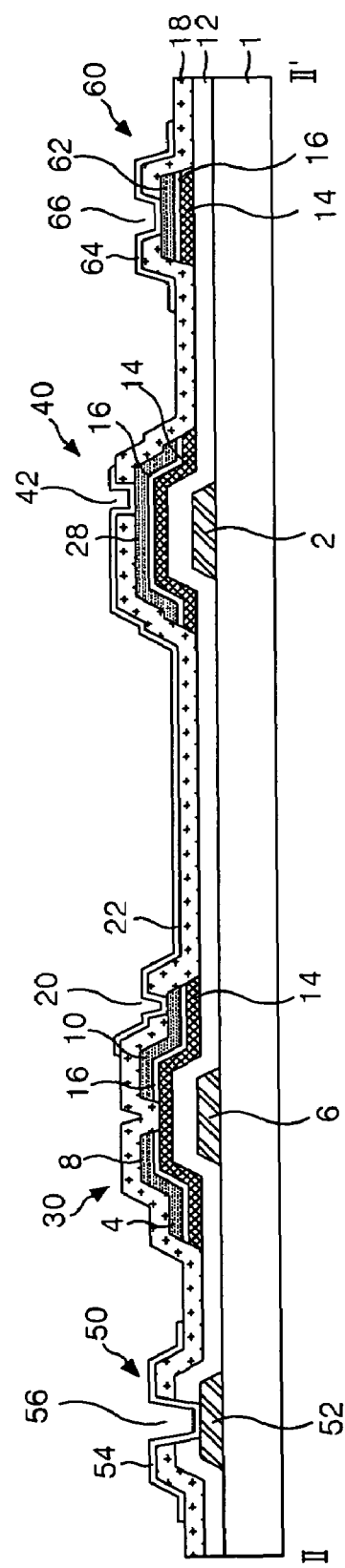
FIG. 2 is a section view of the thin film transistor array substrate taken along the II-II' line in FIG. 1.
Figure 3A:
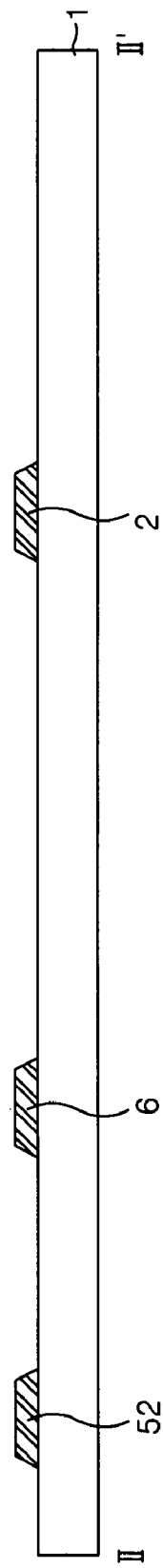
FIG. 3A to FIG. 3D are section views illustrating a method of fabricating the thin film transistor array substrate shown in FIG. 2 step by step.
Figure 3B:
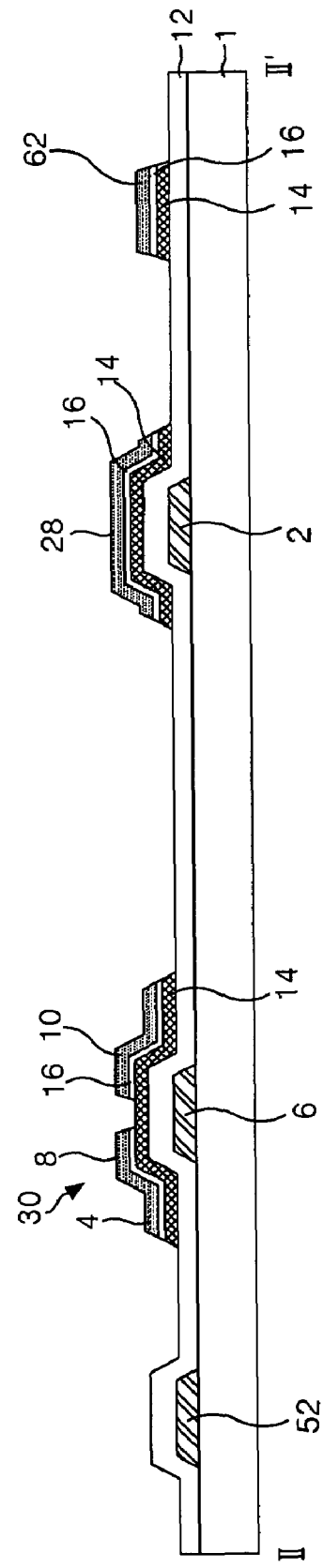
Figure 3C:
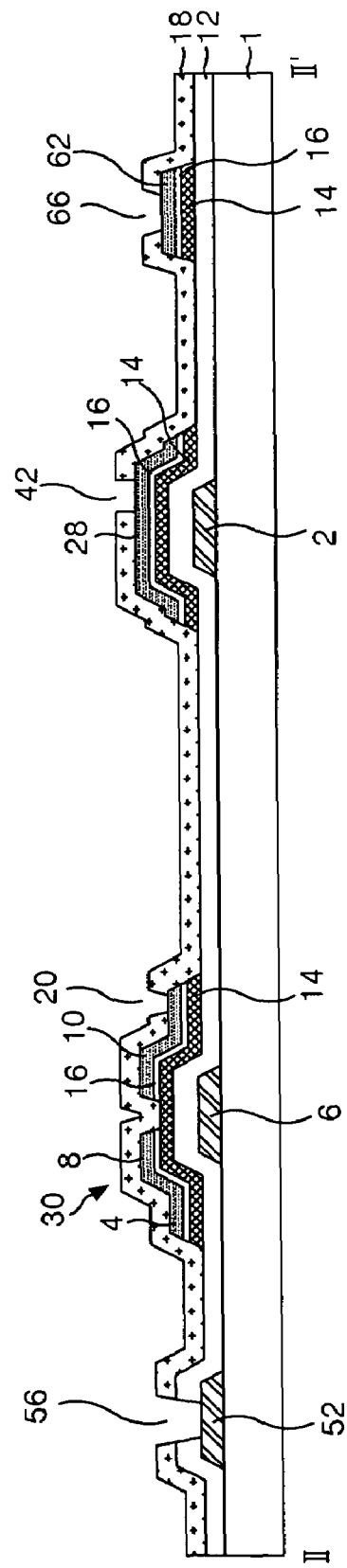
Figure 3D:
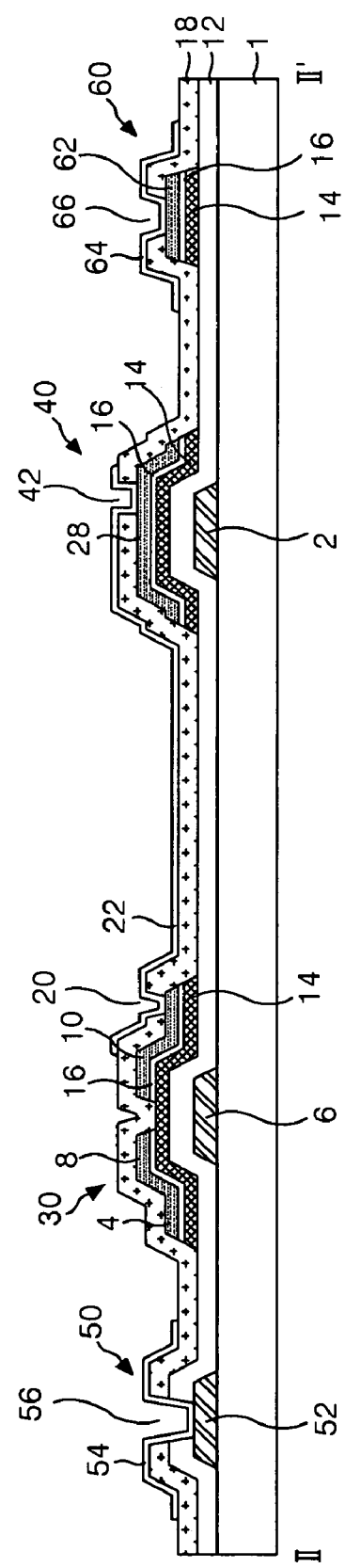
Figure 4:
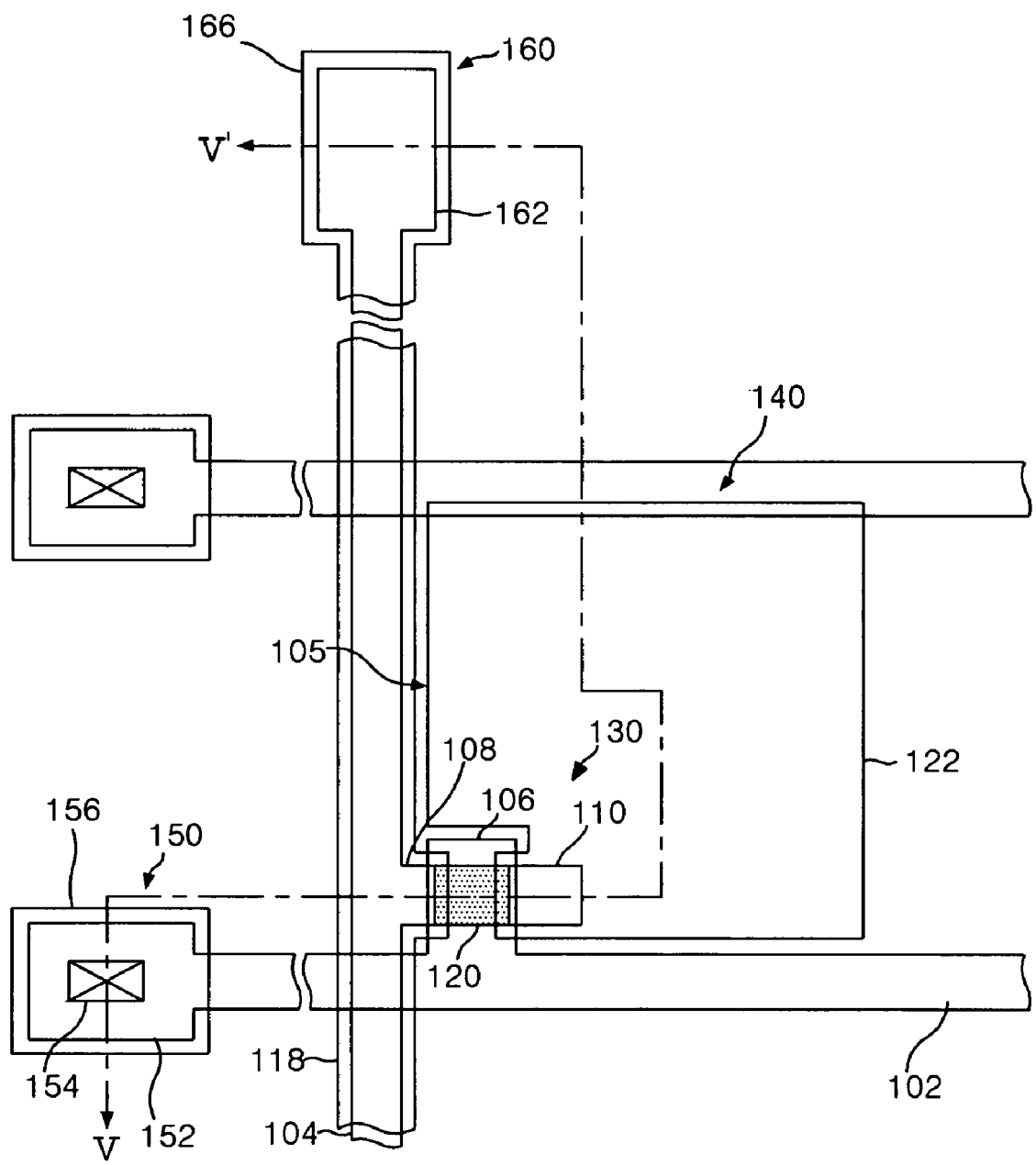
FIG. 4 is a plan view showing a structure of a thin film transistor array substrate according to an embodiment of the present invention.
Figure 5:
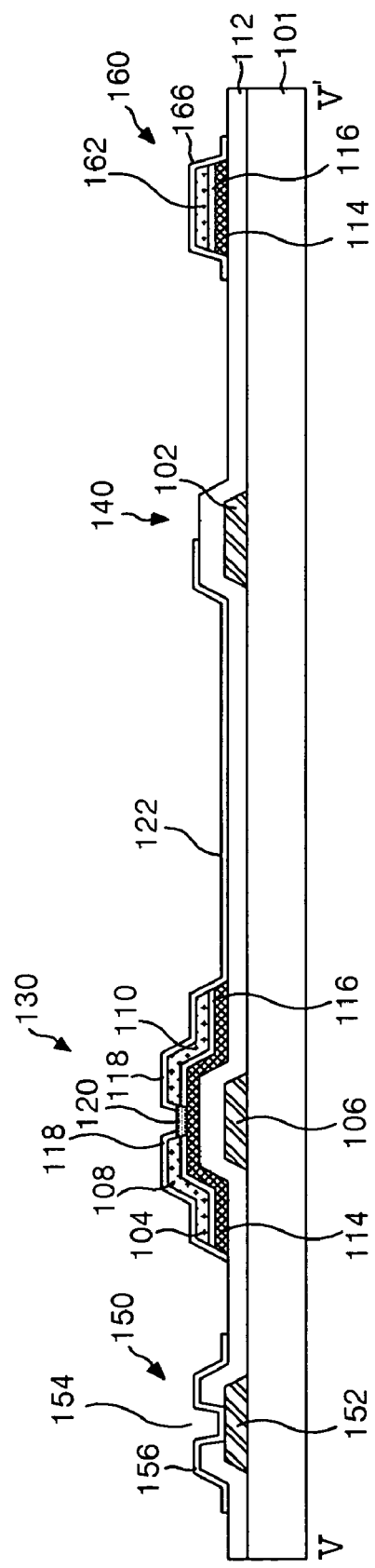
FIG. 5 is a section view of the thin film transistor array substrate taken along the V-V' line in FIG. 4.

FIG. 4 is a plan view showing a structure of a thin film transistor array substrate according to an embodiment of the present invention, and FIG. 5 is a section view of the thin film transistor array substrate taken along the V-V' line in FIG. 4.

Referring to FIG. 4 and FIG. 5, the thin film transistor array substrate includes a gate line 102 and a data line 104 provided on a lower substrate 101 in such a manner to intersect each other with a gate insulating film 112 therebetween, a thin film transistor 130 provided at each intersection, a pixel electrode 122 provided at a pixel area defined by the intersection structure, and a channel protective film 120 for protecting the thin film transistor 130. Further, the thin film transistor array substrate includes a storage capacitor 140 provided at an overlapping portion between the pixel electrode 122 and the gate line 102, a gate pad 150 connected to the gate line 102, and a data pad 160 connected to the data line 104.

The gate line 102 for supplying a gate signal and the data line 104 for supplying a data signal take a crossing structure with respect to each other to define a pixel area 105.

The thin film transistor 130 allows a pixel signal on the data line 104 to be charged into the pixel electrode 122 and be kept in response to a gate signal on the gate line 102. To this end, the thin film transistor 130 includes a gate electrode 106 connected to the gate line 102, a source electrode 108 connected to the data line 104, and a drain electrode 110 connected to the pixel electrode 122. Further, the thin film transistor 130 includes an active layer 114 overlapping with the gate electrode 106 with the gate insulating film 112 therebetween to define a channel between the source electrode 108 and the drain electrode 110.

The active layer 114 also overlaps with the data line 104 and a lower data pad electrode 162. On the active layer 114, an ohmic contact layer 116 for making the data line 104, the source electrode 108, the drain electrode 110 and the lower data pad electrode 162 is further provided.

The channel protective film 120 is formed from silicon nitride ($SiN_x$) or silicon oxide ($SiO_x$) on the active layer 114 defining a channel between the source electrode 108 and the drain electrode. 110. The channel protective film 120 prevents damage of the active layer 114 forming a channel by stripping a photo-resist pattern upon formation of the source electrode 108, the drain electrode 110 and the pixel electrode 122 and cleaning before or after all of these steps.

The pixel electrode 122 is connected, via a drain contact hole 120 passing through the protective film 118, to the drain electrode 110 of the thin film transistor 130, and is provided at the pixel area 105.

A transparent conductive pattern 118 is formed from the same material as the pixel electrode 122 on the source electrode 108, the drain electrode 110 and the data line 104. The transparent conductive pattern 118 formed on the data line 104 permits a data signal to be applied to the source electrode 108 of each thin film transistor 130 upon breakage of the data line 104. The transparent conductive pattern 108 formed on the source and drain electrodes 108 and 110 prevents corrosion of the source and drain electrodes 108 and 110, which are made from a metal that is susceptible to corrosion such as molybdenum (Mo). The transparent conductive pattern 118 is formed such that it is spaced from the adjacent transparent conductive pattern 118 or the adjacent pixel electrode 122 to the extent that it can prevent a short. The transparent conductive pattern 118 formed on the source electrode 108 is spaced for example, by about 4 to 5 μm from the transparent conductive pattern 118 formed on the drain electrode 110, whereas the transparent conductive pattern 118 formed on the data line 104 is spaced for example, about 4 to 5 μm from the pixel electrode 122.

Accordingly, an electric field is formed between the pixel electrode 122 to which a pixel signal is applied via the thin film transistor 130 and a common electrode (not shown) supplied with a reference voltage. Such an electric field rotates liquid crystal molecules between the color filter array substrate and the thin film transistor array substrate due to dielectric anisotropy. Transmittance of light through the pixel area 105 is differentiated depending upon a rotation extent of the liquid crystal molecules, thereby implementing a gray level scale.

The storage capacitor 140 consists of the gate line 102, and the pixel electrode 122 overlapping with the gate line 102 with the gate insulating film 112 therebetween and directly connected to the pixel electrode 122. The storage capacitor 140 allows a pixel signal charged in the pixel electrode 122 to be stably maintained until the next pixel signal is charged.

The gate pad 150 is connected to a gate driver (not shown) to apply a gate signal generated from the gate driver to the gate line 102. The gate pad 150 is comprised of a lower gate pad electrode 152 extended from the gate line 102, and an upper gate pad electrode 156 connected, via a contact hole 154 passing through the gate insulating film 112, to the lower gate pad electrode 152.

The data pad 160 is connected to a data driver (not shown) to apply a data signal generated from the data driver to the data line 104. The data pad 160 is comprised of a lower data pad electrode 162 extended from the data line 104, and an upper data pad electrode 166 directly connected to the lower data pad electrode 162.

Figure 6A:
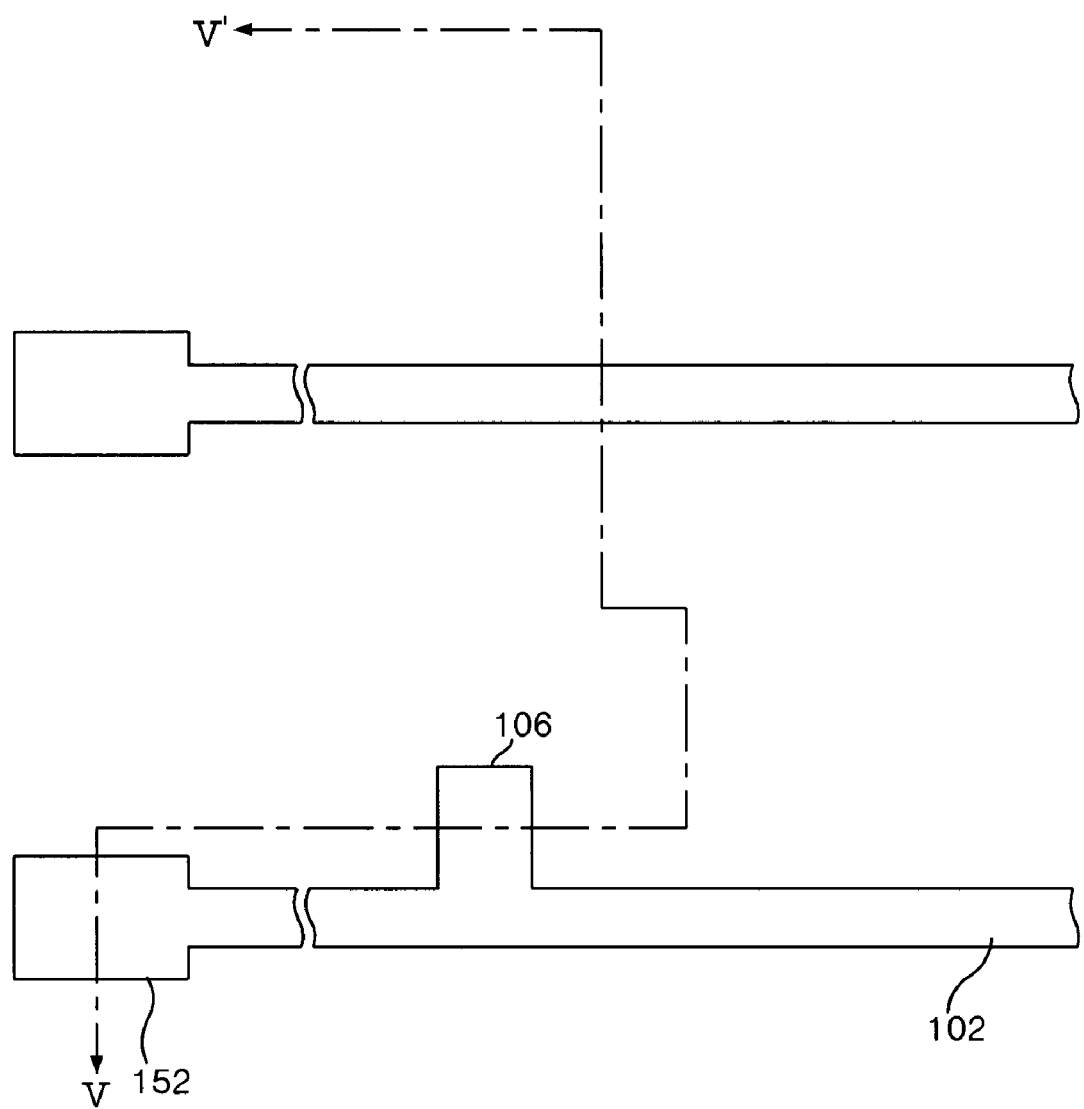
FIG. 6A and FIG. 6B are a plan view and a section view representing a first conductive pattern group formed by a first mask process, respectively.
Figure 6B:
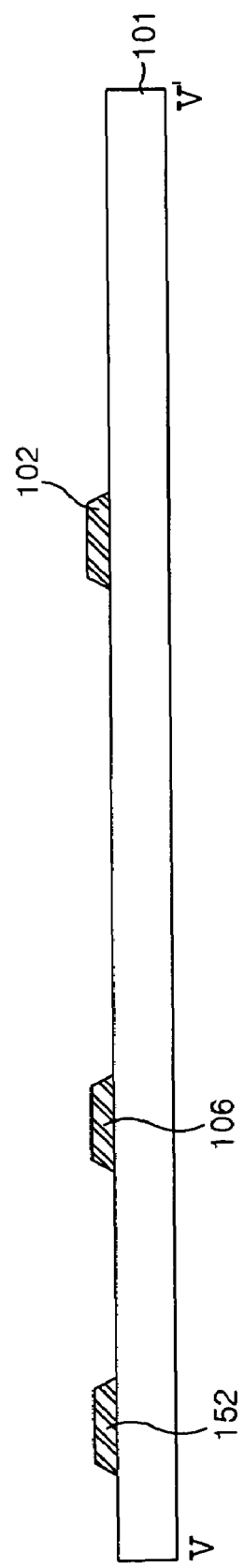

FIG. 6A and FIG. 6B are a plan view and a section view representing a method of fabricating a first conductive pattern group of the thin film transistor array substrate according to the embodiment of the present invention, respectively.

Referring to FIG. 6A and FIG. 6B, a gate pattern including the gate line 102, the gate electrode 102 and the lower gate pad electrode 152 is formed on the lower substrate 101 by the first mask process.

More specifically, a gate metal layer is formed on the lower substrate 101 by a deposition technique such as sputtering. Then, the gate metal layer is patterned by photolithography and etching using a first mask, thereby providing the gate pattern including the gate line 102, the gate electrode 106 and the lower gate pad electrode 152. The gate metal is formed from aluminum (Al) or an aluminum group metal including Al/Nd.

Figure 7A:
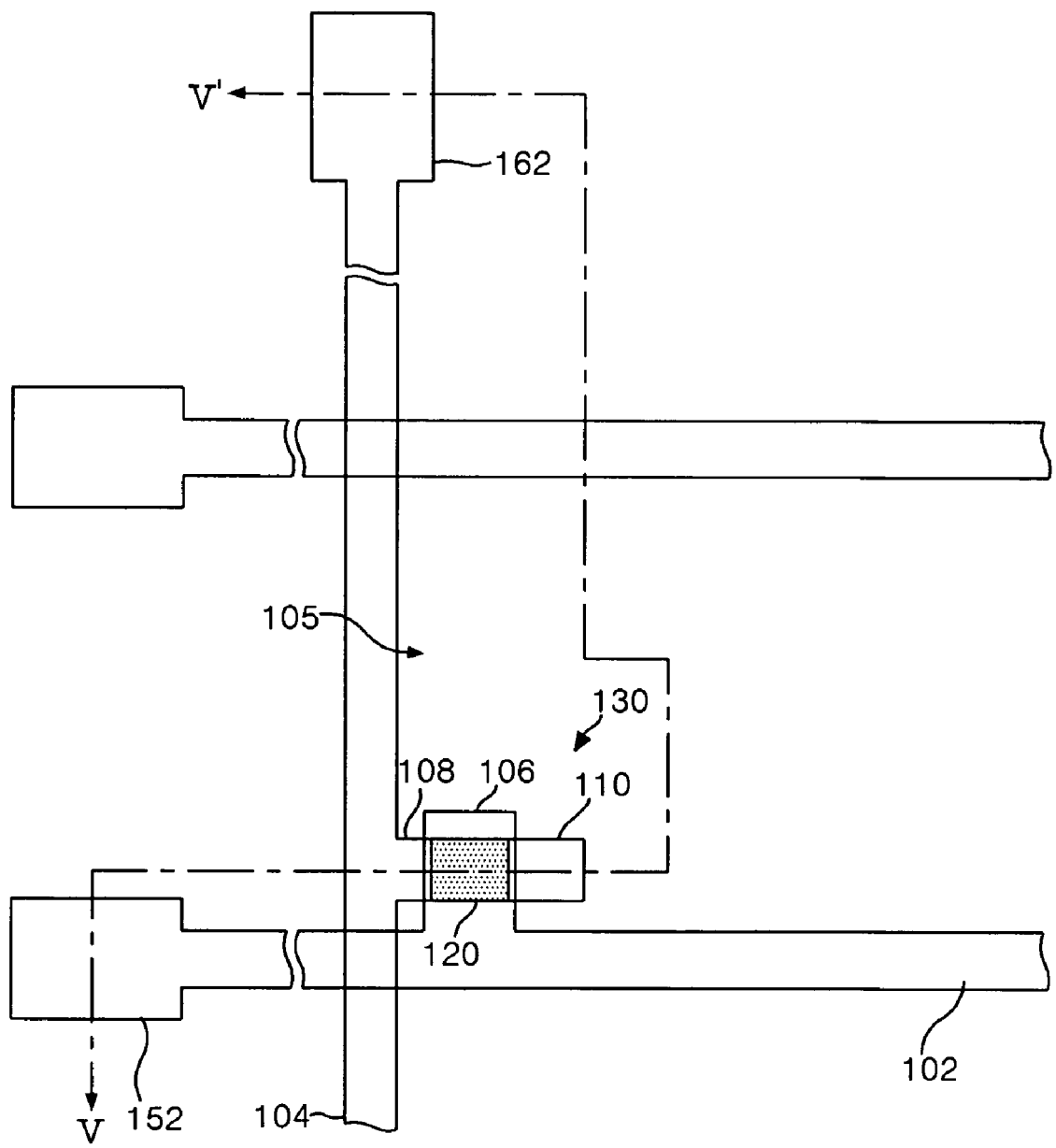
FIG. 7A and FIG. 7B are a plan view and a second view representing a semiconductor pattern, a second conductive pattern group and a channel protective film, respectively.
Figure 7B:
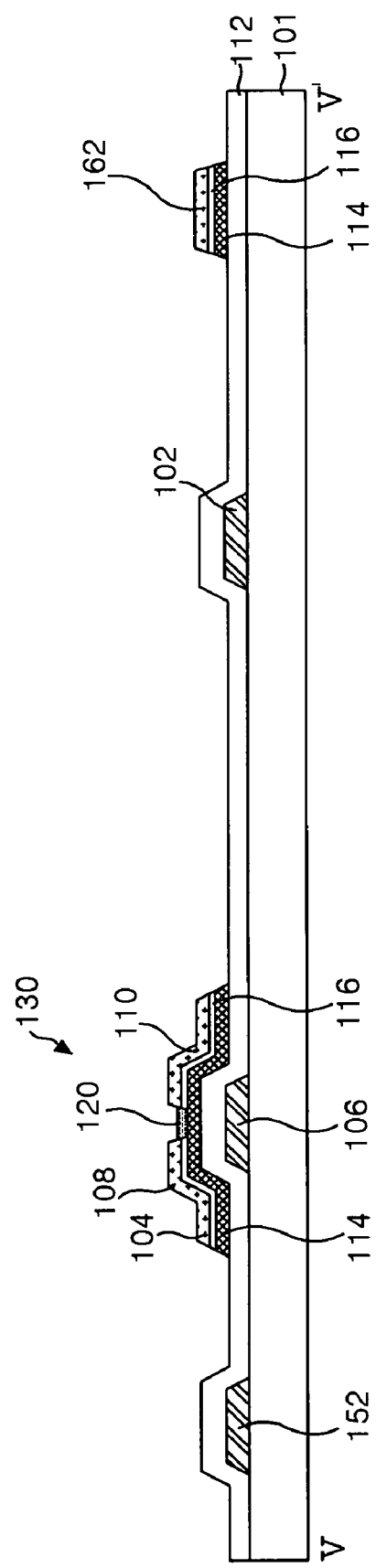

FIG. 7A and FIG. 7B are a plan view and a section view representing a method of fabricating the semiconductor pattern, the second conductive pattern group and the channel protective film of the thin film transistor array substrate according to the embodiment of the present invention, respectively.

Referring to FIG. 7A and FIG. 7B, the gate insulating film 112 is coated onto the lower substrate 101 provided with the first conductive pattern group. Further, a semiconductor pattern including the active layer 114 and the ohmic contact layer 116 and a second conductive pattern group including the data line 104, the source and drain electrodes 108 and 110 and the lower data pad electrode 162 is formed on the gate insulating film 112 by the second mask process. Furthermore, the channel protective film 120 is formed on the active layer 114 defining a channel between the source electrode 108 and the drain electrode 110.

Figure 8A:
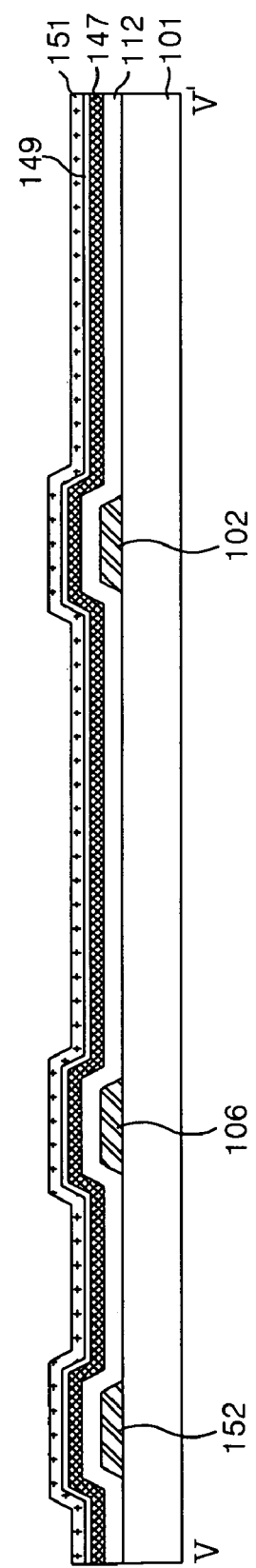

More specifically, as shown in FIG. 8A, a first semiconductor layer 147, a second semiconductor layer 149 and a source/drain metal layer 151 are sequentially formed on the gate insulating film 112 by a deposition technique such as PECVD or sputtering, etc. Herein, the first semiconductor layer 147 is unintentionally doped amorphous silicon, whereas the second semiconductor layer 149 is N-type or P-type amorphous silicon. The source/drain metal layer 151 is made from a metal such as molybdenum (Mo) or copper (Cu), etc.

Figure 8B:
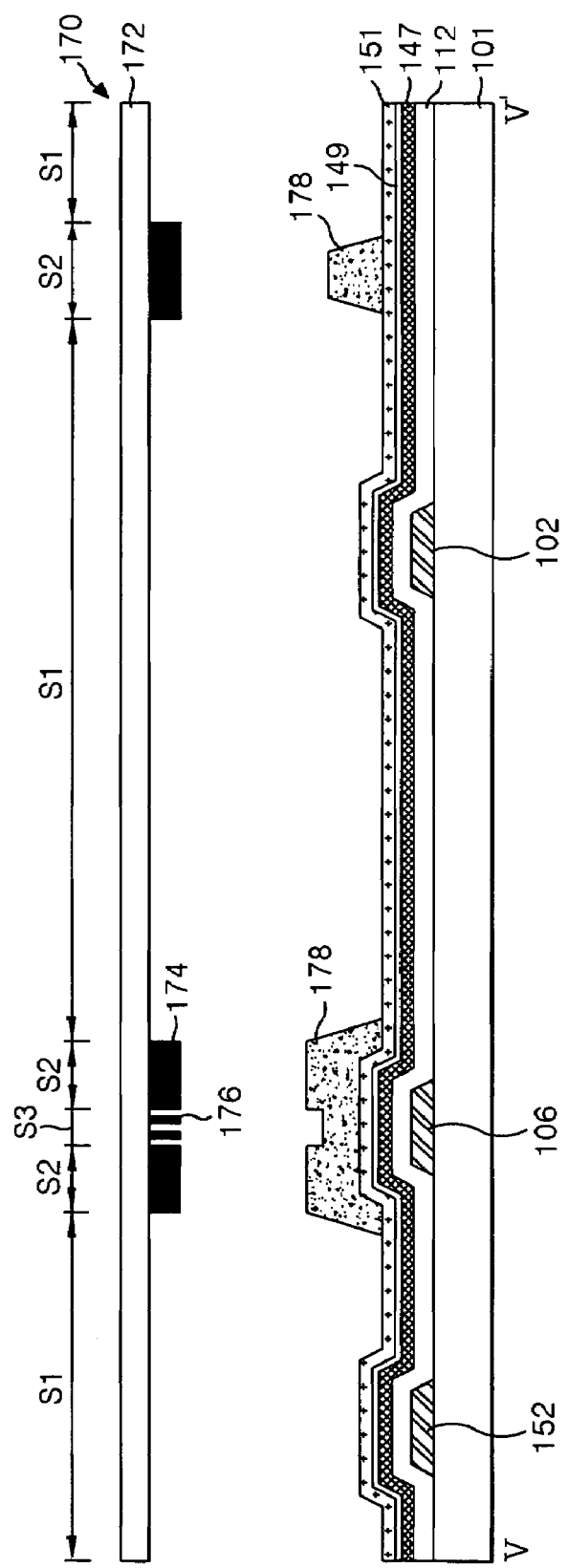

Then, a photo-resist film is formed on the source/drain metal layer 151 and thereafter a partial exposure second mask 170 is aligned at the upper portion of the lower substrate 101 as shown in FIG. 8B. The second mask 107 includes a mask substrate 172 made from a transparent material, a shielding part 174 provided at a shielding area S2 of the mask substrate 172, and a diffractive exposure part (or semi-transmitting part) 176 provided at a partial exposure area S3 of the mask substrate 172. Herein, an area exposed by the mask substrate 172 becomes an exposure area S1. The photo-resist film using the second mask 170 is exposed to the light and then developed, thereby providing a photo-resist pattern 178 having a step coverage at the shielding area S2 and the partial exposure area S3 in correspondence with the shielding part 174 and the diffractive exposure part 176 of the second mask 170. In other words, the photo-resist pattern 178 provided at the partial exposure area S3 has a second height h2 lower than a first height h1 of the photo-resist pattern 178 provided at the shielding area S2.

The source/drain metal layer 151 is patterned by wet etching using the photo-resist pattern 178 as a mask, thereby providing a second conductive pattern group including the data line 104, the source electrode 108 and the drain electrode 110 connected to the data line 104 and the lower data pad electrode 152 as shown in FIG. 8C.

Figure 8D:
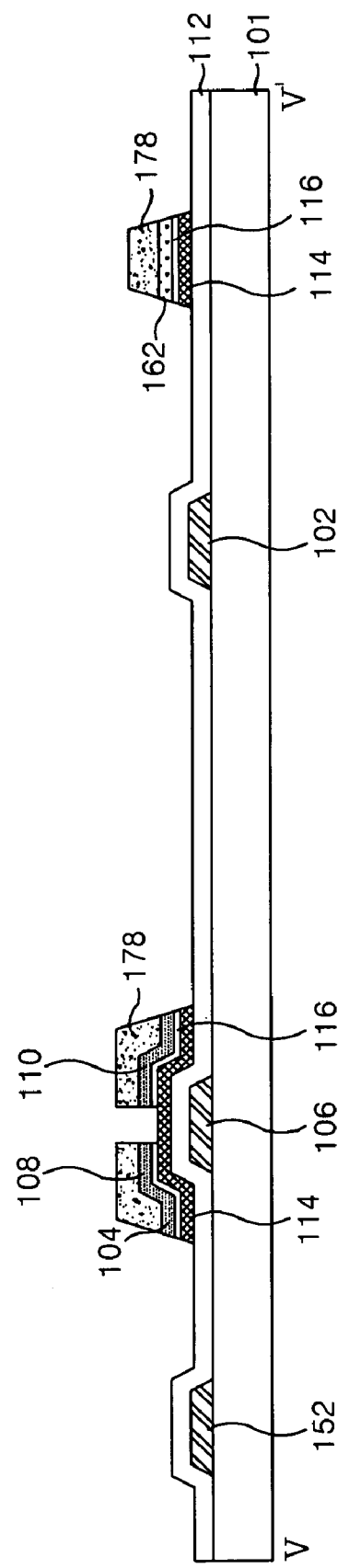

Further, the first semiconductor layer 147 and the second conductive layer 149 are patterned by dry etching using the photo-resist pattern 178 as a mask, thereby providing the ohmic contact layer 116 and the active layer 114 along the second conductive pattern group as shown in FIG. 8D. Then, using oxygen ($O_2$) plasma to ash the structure, the height of the photo-resist pattern 178 having a second height h2 at the partial exposure area S3 while the photo-resist pattern 178 having a first height h1 at the shielding area S2 is lowered. The diffractive exposure area S3, that is, the source/drain metal layer 154 and the ohmic contact layer 116 provided at the channel portion of the thin film transistor is removed by the etching process using the above-mentioned photo-resist pattern. Thus, the active layer 114 of the channel portion is exposed to disconnect the source electrode 108 from the drain electrode 110.

As shown in FIG. 8E, the surface of the exposed active layer 114 of the channel portion is exposed to $O_x$ (e.g., $O_2$) or $N_x$ (e.g., $N_2$) plasma by utilizing the photo-resist pattern 178 as a mask. Then, $O_x$ or $N_x$ reacts with silicon (Si) contained in the active layer 114 to thereby provide the channel protective film 120 formed from $SiO_x$ or $SiN_x$. The channel protective film 120 prevents damage of the active layer 114 of the channel portion caused by a stripper liquid and a cleaner liquid used in post formation processes, that is, stripping and cleaning.

Figure 8F:
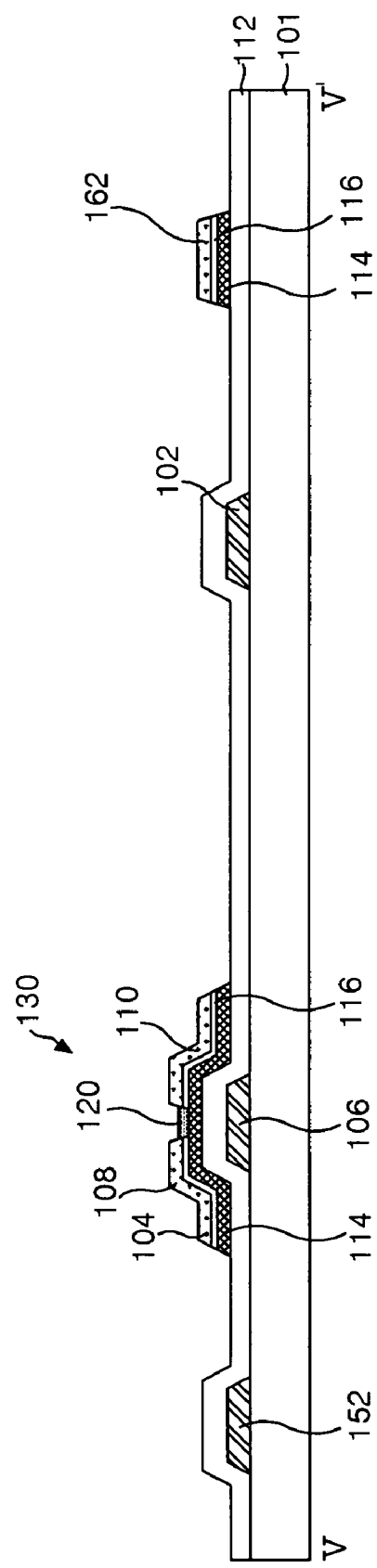

As shown in FIG. 8F, the photo-resist pattern 178 left on the second conductive pattern group is removed by stripping.

Figure 9A:
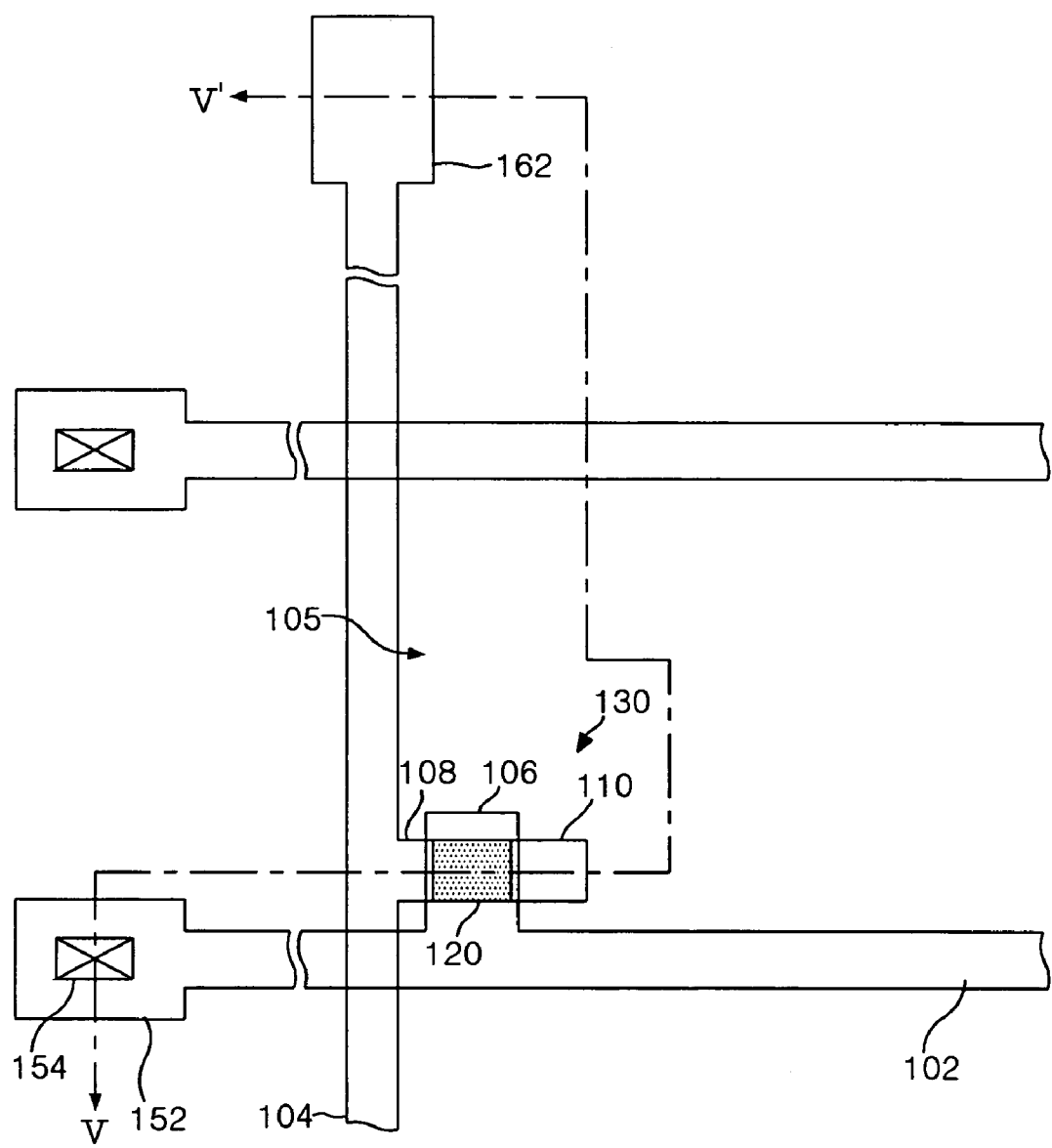
FIG. 9A and FIG. 9B are a plan view and a section view showing a contact hole formed by a third mask process.
Figure 9B:
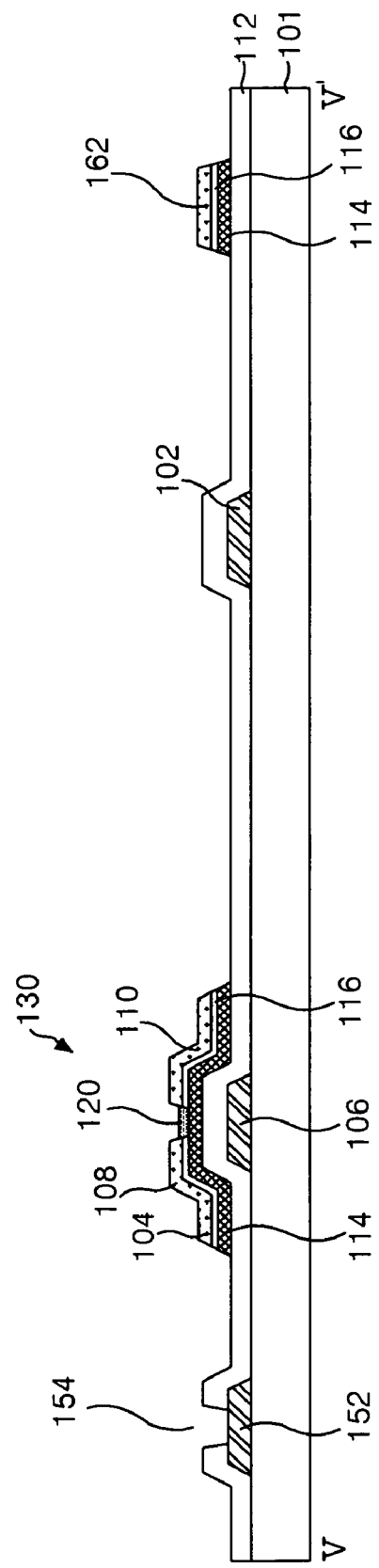

Referring to FIG. 9A and FIG. 9B, the contact hole 154 for exposing the gate insulating film 112 formed to cover the lower gate pad electrode 152 is provided by the third mask process.

More specifically, the gate insulating film 112 formed to cover the lower gate pad electrode 152 is patterned by photolithography and etching using a third mask, thereby providing the contact hole 154 for exposing the lower gate pad electrode 152.

Figure 10A:
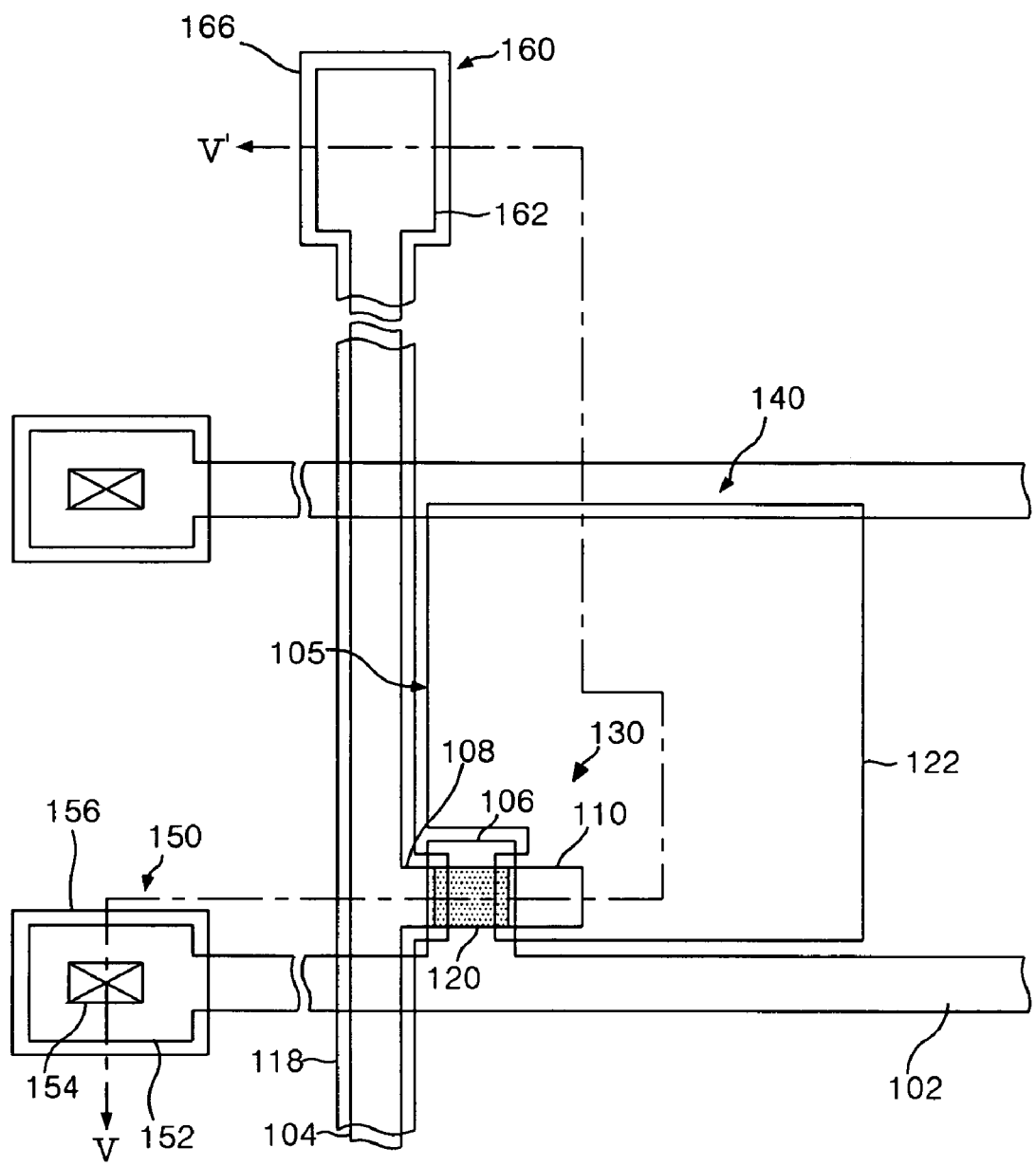
FIG. 10A and FIG. 10B are a plan view and a section view representing a third conductive pattern group formed by a fourth mask process.
Figure 10B:
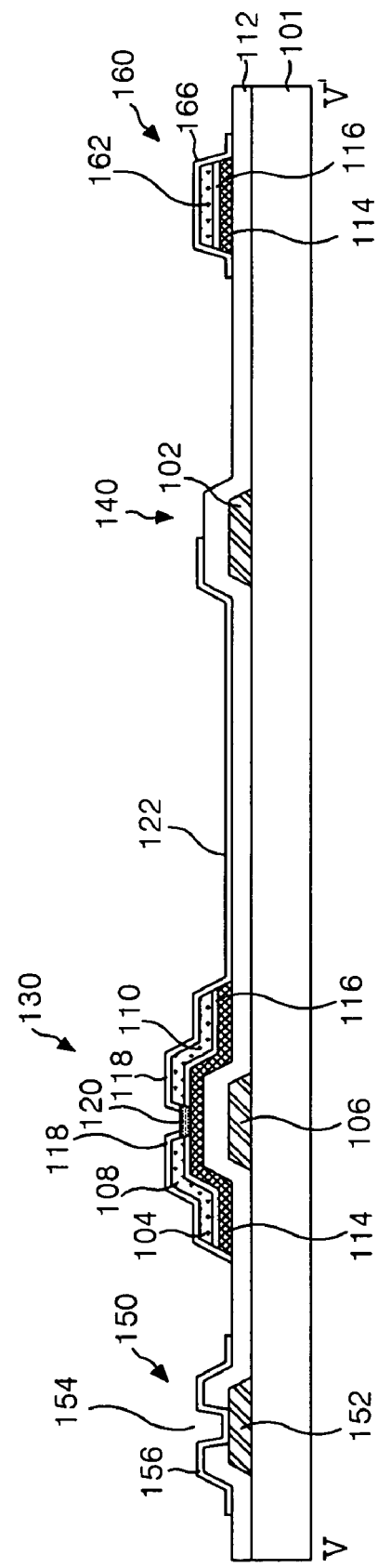

Referring to FIG. 10A and FIG. 10B, a third pattern group including the pixel electrode 122, the transparent conductive pattern 118, the upper gate pad electrode 156 and the upper data pad electrode 166 is formed on the lower substrate 101 provided with the contact hole 154 by the fourth mask process.

More specifically, a transparent conductive film is coated onto the substrate 101 provided with the contact hole 154 by a deposition technique such as sputtering or the like. Herein, the transparent conductive film is formed from indium-tin-oxide (ITO), tin-oxide (TO), indium-tin-zinc-oxide (ITZO) or indium-zinc-oxide (IZO). Then, the transparent conductive film is patterned by photolithography and etching to thereby provide the third conductive pattern group including the pixel electrode 122, the transparent conductive pattern 118, the upper gate pad electrode 156 and the upper data pad electrode 166. The pixel electrode 122 is directly connected to the drain electrode 110. The transparent conductive pattern 118 is formed thereon and is directly connected to the data line 104, the source electrode 108 and the drain electrode 110. The upper gate pad electrode 156 is electrically connected, via the contact hole 154, to the lower gate pad electrode 152. The upper data pad electrode 166 is directly connected to the lower data pad electrode 162.

As described above, according to the present invention, the exposed active 114 layer corresponding to the channel of the thin film transistor can be protected by the channel protective film 120 without any additional protective film. Thus, the deposition equipment or coating equipment for forming the protective film in the prior art may be eliminated to reduce the manufacturing cost, and an opening of the pixel electrode 122 generated from the step coverage of the contact hole exposing the drain electrode in the prior art can be prevented.

Furthermore, according to the present invention, the transparent conductive film is formed on the data line 104, the source electrode 108 and the drain electrode 110. Accordingly, a pixel signal can be supplied to each thin film transistor with the aid of the transparent conductive pattern 118 without repairing the data line 104 if the data line 104 is open or preventing corrosion of the data line, the source electrode 108 and the drain electrode 110.

Moreover, according to the present invention, the storage capacitor 140 is formed by the gate line 102 and the pixel electrode 122 overlapping with each other with the gate insulating film 112 therebetween. Accordingly, a distance between two conductive materials making the storage capacitor 140 is reduced, so that a capacitance value of the storage capacitor 140 can be increased to improve the picture quality and avoid stain, etc.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A thin film transistor array substrate, comprising:
   a gate electrode connected to a gate line;
   a source electrode connected to a data line, which crosses the gate line to define a pixel area;
   a drain electrode opposed to the source electrode with a channel therebetween;
   a active layer in the channel;
   a first and second ohmic contact layers disposed on the active layer and being spaced apart from each other, wherein the first ohmic contact layer is beneath the source electrode and the second ohmic contact layer is beneath the drain electrode;
   a pixel electrode contacting with the drain electrode; and
   a channel protective film provided on the active layer corresponding to the channel to protect the active layer in the channel, wherein all of the channel protective film is disposed only between the first and second ohmic contact layers,
   wherein a bottom surface of the channel protective film is lower than a uppermost surface of the first and second ohmic contact layers and a top surface of the channel protective film is higher than the uppermost surface of the first and second ohmic contact layers.

2. The thin film transistor array substrate as claimed in claim 1, wherein the channel protective film comprises at least one of silicon nitride or silicon oxide.

3. The thin film transistor array substrate as claimed in claim 1, wherein the first and second ohmic contact layers expose the active layer between the source and drain electrodes.

4. The thin film transistor array substrate as claimed in claim 1, further comprising a transparent conductive pattern, formed from the same material as the pixel electrode, disposed on and contacted with the data line and the source electrode.

5. The thin film transistor array substrate as claimed in claim 1, further comprising a storage capacitor that contains overlapping portions of the gate line and the pixel electrode with the gate insulating film therebetween.

6. The thin film transistor array substrate as claimed in claim 1, further comprising a gate pad extending from the gate line, wherein the gate pad includes:
   a lower gate pad electrode connected to the gate line;
   a contact hole passing through the gate insulating film to expose the lower gate pad electrode; and
   an upper gate pad electrode connected, via the contact hole, to the lower gate pad electrode.

7. The thin film transistor array substrate as claimed in claim 1, further comprising a data pad extending from the data line, wherein the data pad includes:
   a lower data pad electrode connected to the data line and provided on the semiconductor layer; and
   an upper data pad electrode on the lower data pad electrode, substantially all of the upper data pad electrode that overlaps the lower data pad electrode also contacts the lower data pad electrode, wherein the upper data pad electrode forms from the same material as the pixel electrode.

8. The thin film transistor array substrate as claimed in claim 3, wherein the channel protective film is disposed on the active layer exposed by the first and second ohmic contact layers.

9. The thin film transistor array substrate as claimed in claim 5, wherein only the gate insulating film is disposed between the gate line and the pixel electrode in the storage capacitor.

* * * * *

UNITED STATES PATENT AND TRADEMARK OFFICE
CERTIFICATE OF CORRECTION

PATENT NO.         : 7,586,123 B2                                        Page 1 of 1
APPLICATION NO.    : 11/149689
DATED              : September 8, 2009
INVENTOR(S)        : Young Seok Choi It is certified that error appears in the above-identified patent and that said Letters Patent is hereby corrected as shown below:

On the Title page,

[*] Notice:    Subject to any disclaimer, the term of this patent is extended or adjusted under 35 USC 154(b) by (191) days Delete the phrase "by 191 days" and insert -- by 346 days --

Signed and Sealed this

Fourth Day of May, 2010

David J. Kappos
*Director of the United States Patent and Trademark Office*